United States Patent
Sasaki

(10) Patent No.: US 6,281,553 B1
(45) Date of Patent: Aug. 28, 2001

(54) SEMICONDUCTOR DEVICE, ELECTROSTATIC DISCHARGE PROTECTION DEVICE, AND DIELECTRIC BREAKDOWN PREVENTING METHOD

(75) Inventor: Makoto Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/190,827

(22) Filed: Nov. 12, 1998

(30) Foreign Application Priority Data

Nov. 12, 1997 (JP) .................................................. 9-325156

(51) Int. Cl.$^7$ .................................................. H01L 23/62
(52) U.S. Cl. .......................................... 257/356; 257/361
(58) Field of Search ............................ 257/356, 360, 257/361, 773

(56) References Cited

U.S. PATENT DOCUMENTS 5,637,902  6/1997  Jiang ..................................... 257/379

FOREIGN PATENT DOCUMENTS

| 0 292 327 | 11/1988 | (EP) . |
| 0 656 659 | 6/1995 | (EP) . |
| 2 281 813 | 3/1995 | (GB) . |
| 2-238668 | 9/1990 | (JP) . |
| 6-151744 | 5/1994 | (JP) . |
| 9-97844 | 4/1997 | (JP) . |

*Primary Examiner*—Mark V. Prenty
(74) *Attorney, Agent, or Firm*—Young & Thompson

(57) ABSTRACT

The semiconductor device includes an MOS transistor in which a source, a gate, and a well are connected to an ground potential or a source potential of a source wiring, and a drain is connected to an input/output wiring. In the electrostatic discharge protection device of this semiconductor device, the contact area of a well contact hole to the well is limited by a gate electrode 4 insulated from the well 12 by a gate insulation film 13 (oxide film) provided in the area of the well contact 8, and consequently, it becomes easy to cause an operation of a parasitic bipolar transistor of an MOS transistor, and the electrostatic protection may be carried out. Accordingly, the MOS transistor in the LSI can be protected against the electrostatic breakdown.

9 Claims, 8 Drawing Sheets

TO INTERNAL
CIRCUIT

TO INTERNAL CIRCUIT

SEMICONDUCTOR DEVICE, ELECTROSTATIC DISCHARGE PROTECTION DEVICE, AND DIELECTRIC BREAKDOWN PREVENTING METHOD

BACKGROUND OF THE INVENTION

1. Field of the Invention

The present invention relates to the technique of a semiconductor device, an electrostatic discharge protection device, and an electrostatic breakdown preventing method, and more specifically, relates to the technique of insulation breakdown of an MOS transistor.

2. Description of the Related Art

In a semiconductor device, especially in an integrated circuit in which the circuit comprises an MOS transistor, a gate insulation breakdown may easily be caused by the electrostatic discharge from the outside to the signal input/output section, and therefore, it is indispensable to provide an electrostatic breakdown protective element to the input/output section.

FIG. 1 is a plan view showing an electrostatic discharge protection device of a conventional semiconductor device described in Japanese patent Application Laid-Open No. 2-238668, and FIG. 2 is a cross sectional view showing a conventional electrostatic breakdown protective element.

In these figures, numeral 3 denotes a gate electrode, 5 denotes a drain contact, 6 denotes a gate contact, 7 denotes a source contact, 8 denotes a well contact, 9 denotes a $p^+$ diffusion layer for the connection to a p well, 10 denotes a source, 11 denotes a drain, 12 denotes a p well, 20 denotes an aluminum wiring for connecting the gate electrode to the well, 21 denotes a $p^+$ diffusion layer for the connection to the well, and 22 denotes a contact hole for connecting the gate electrode to the well. Furthermore, 13 denotes a gate oxide film, and 14 denotes a field oxide film.

In this conventional technique, an internal circuit to be a protected element and an input/output pad are connected to the drain 11. The gate electrode 3 is connected to the p well 12 by the aluminum wiring 20, the contact hole 22, and the $p^+$ diffusion layer 21. Furthermore, the p well 12 is connected to the ground electrode by the $p^+$ diffusion layer 9.

The action of this electrostatic breakdown protective element will be described. When a high voltage is applied to the drain 11 connected to the input/output pad, a breakdown arises in the junction between the drain 11 and well 12, and a current flows from the drain 11 to the well 12, and the internal circuit is protected. Even if the potential of the p well 12 is raised by the current flowing into the p well 12 during the breakdown, the gate electrode 3 is connected to the p well 12, and the gate electrode 3 and the p well 12 have approximately the same potential, and therefore, it does not occur that the gate insulation film is broken by the difference in potential between the gate electrode 3 and the p well 12.

However, in the conventional electrostatic discharge protection device, the breakdown in the junction between the diffusion layer and the well is used for the electrostatic protection. The breakdown voltage of the junction depends on the impurity concentration of the junction portion, and generally, it is approximately 8 to 10 V. On the other hand, the gate oxide film of an MOS transistor is broken by an electric field approximately not less than 15 MV/cm, regardless of the film thickness. Therefore, if the gate oxide film is made to be thin by fining of the MOS transistor, the voltage to cause the gate insulation breakdown becomes lower than the breakdown voltage of the junction.

For example, in a gate oxide film having a film thickness of 4 nm, the gate oxide film causes a insulation breakdown at 6 V, and this is clearly a voltage lower than the breakdown voltage of the junction of 8 V. Consequently, in the case where the breakdown of the junction is used for the principle of the action of the protective element, it becomes impossible to protect the internal MOS transistor.

SUMMARY OF THE INVENTION

An object of the present invention is to provide an electrostatic discharge protection device which can prevent the gate insulation breakdown of an internal circuit by acting at a voltage lower than the voltage to cause the gate insulation breakdown, a semiconductor device including this electrostatic discharge protection device, and an electrostatic breakdown preventing method.

The semiconductor device according to the present invention is a device which prevents the gate insulation breakdown by an electrostatic discharge from the outside to the signal input/output section of an integrated circuit including an MOS transistor. This semiconductor device is arranged such that the contact area of the well contact hole to the well is limited by the gate electrode provided in the contact hole area so that the connection resistance to the well may be raised.

In that case, it is preferable to set the connection resistance of the contact hole to the well at a resistance value at which the parasitic bipolar transistor of the MOS transistor can be made to be in the on state at a voltage not more than the voltage to cause a gate insulation breakdown.

Furthermore, another semiconductor device according to the present invention, comprises:

a well of one conductive type which is formed on the surface layer portion in a semiconductor substrate of one conductive type and has an impurity concentration higher than that of the semiconductor substrate;

a source and a drain of the opposite conductive type which are formed on the surface layer portion in the well of one conductive type and are separated by a channel area;

a well contact area of one conductive type which is formed on the surface layer portion in the well of one conductive type and is separated from the source and drain by a field insulation film;

a contact hole which is formed in the surface of the semiconductor substrate and connects the metal wiring on the well contact area and the well contact area;

a gate electrode which is formed on the channel area through the gate insulation film to the surface of the semiconductor substrate; and a gate electrode which is formed in the well contact hole area through the gate insulation film to the surface of the semiconductor substrate.

Then, the drain is connected to the input/output wiring, and said source, gate electrode, and well contact are connected to the ground potential or the source potential as source wiring.

In that case, such an arrangement that the contact area to the well of one conductive type is limited by the gate electrode formed in the well contact hole area, is also possible.

Furthermore, such an arrangement that the contact area to the well of one conductive type is limited by arranging the gate electrodes formed in the well contact hole area on both sides of the well contact, is also possible.

Furthermore, such an arrangement that the contact area to the well of one conductive type is limited by arranging the gate electrodes formed in the well contact hole area, in the form of surrounding the periphery of the well contact, is also possible.

Furthermore, such an arrangement that the contact area to the well of one conductive type is limited by arranging the gate electrode formed in the well contact hole area, in the central portion of the well contact, is also possible.

Moreover, such an arrangement that the contact area to the well of one conductive type is limited by connecting the gate electrode formed in the well contact hole area, to the gate electrode formed on the channel area, is also possible.

Furthermore, the electrostatic discharge protection device of the present invention is an electrostatic discharge protection device of a semiconductor device including an MOS transistor, in which the source, gate, and well are connected to the ground potential or the source potential of the source wiring and the drain is connected to the input/output wiring. This electrostatic discharge protection device includes such a function that the contact area of the well contact hole to the well is limited by the gate electrode insulated from the well with the gate insulation film provided in the well contact area, and that the action of the parasitic bipolar transistor of the MOS transistor is made to easily arise so that the electrostatic protection may be performed.

On the other hand, the electrostatic protective method according to the present invention is an insulation breakdown preventing method of a semiconductor device for preventing the gate insulation breakdown by the electrostatic discharge from the outside to the signal input/output section of an integrated circuit including an MOS transistor. In this electrostatic protective method, the contact area of the well contact hole to the well is limited by the gate electrode provided in the contact hole area so that the connection resistance to the well may be raised, and consequently, the parasitic bipolar transistor of the MOS transistor is made to be in the on state at a voltage not more than the voltage to cause the gate insulation breakdown, so that the excessive voltage applied to the drain may be allowed to flow to the ground electrode or the source electrode.

In the present invention, the contact area of the well contact hole to the well is limited by the gate electrode provided in the contact hole area, so that the connection resistance to the well may be raised. Consequently, the parasitic bipolar transistor of the MOS transistor is made to be in the on state at a voltage not more than the voltage to cause the gate insulation breakdown. Consequently, the excessive voltage applied to the drain is allowed to flow to the ground electrode or the source electrode, so that the circuit may be protected against the electrostatic breakdown.

Consequently, according to the present invention, the techniques can be obtained, which are relating to an electrostatic discharge protection device which can prevent the electrostatic breakdown of the gate insulation film complying with fining of elements, a semiconductor device having an electrostatic discharge protection device, and an insulation breakdown preventing method.

DESCRIPTION OF THE PREFERRED EMBODIMENTS

Preferred embodiments of the present invention will be concretely described below by referring to the attached drawings.

Figure 1:
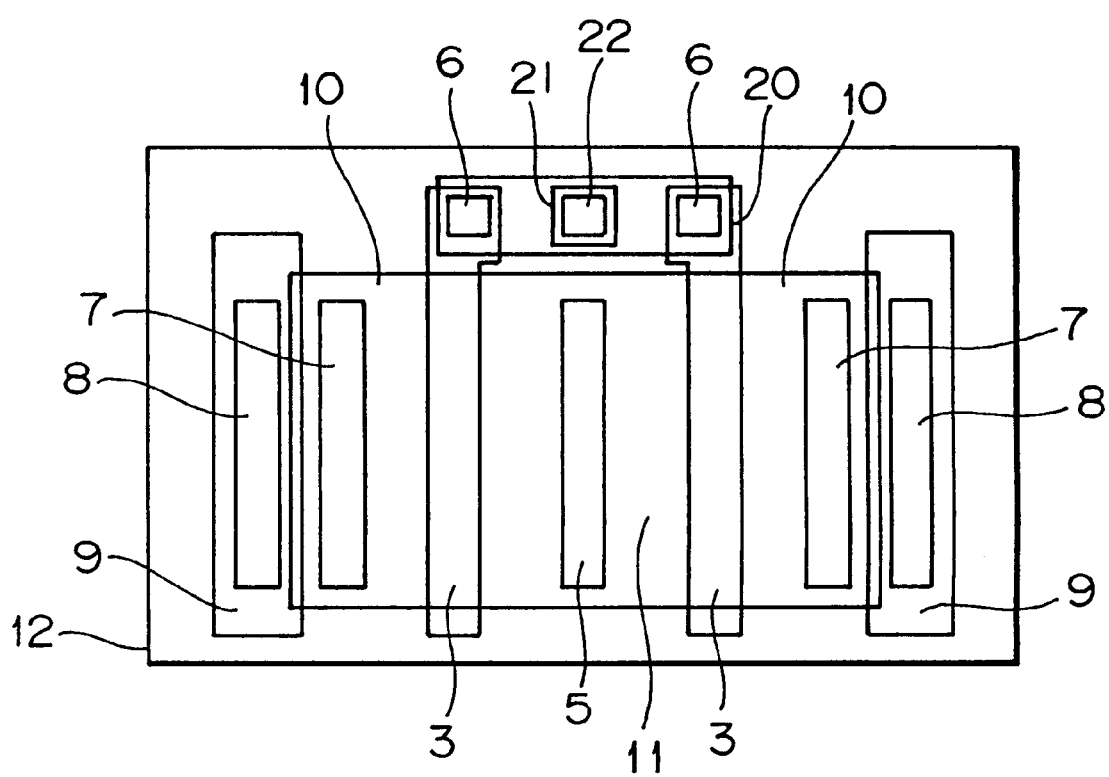
FIG. 1 is a plan view of an electrostatic discharge protection device of a conventional semiconductor device.
Figure 2:
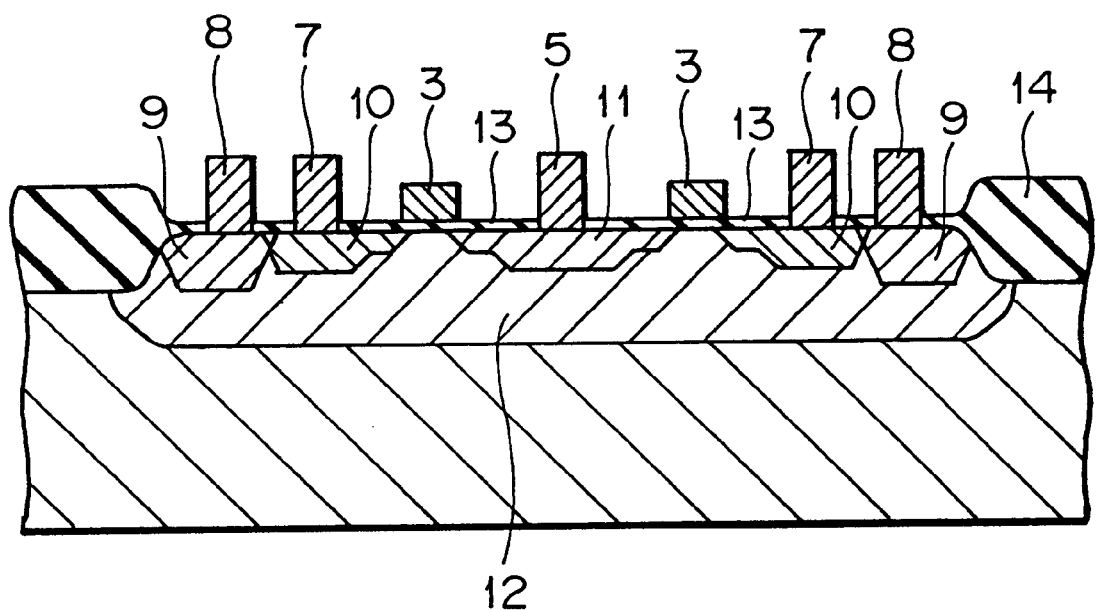
FIG. 2 is, similarly, a cross sectional structural view of an electrostatic discharge protection device of a conventional semiconductor device.
Figure 3:
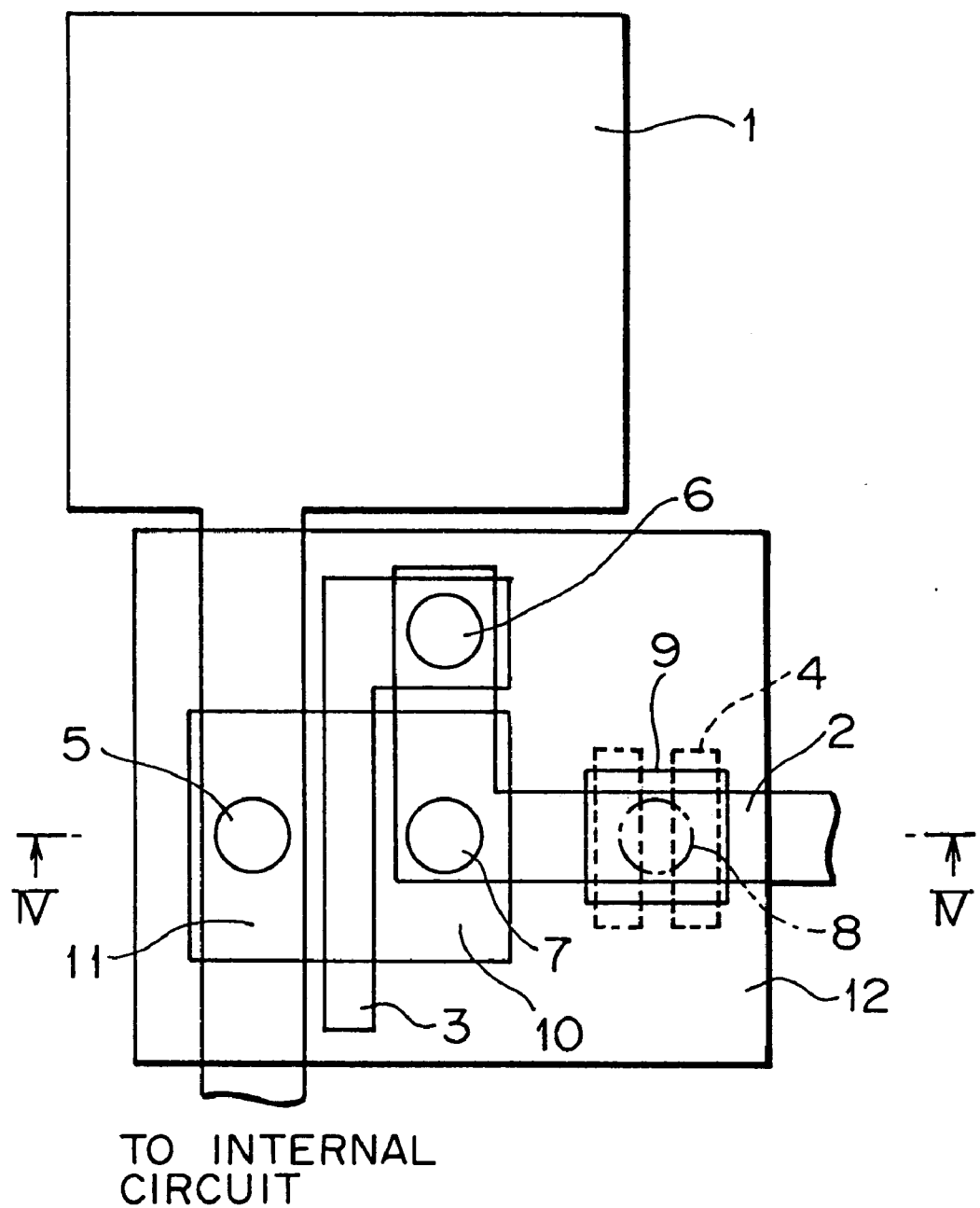
FIG. 3 is a plan view of a semiconductor device according to a first embodiment of the present invention.
Figure 4:
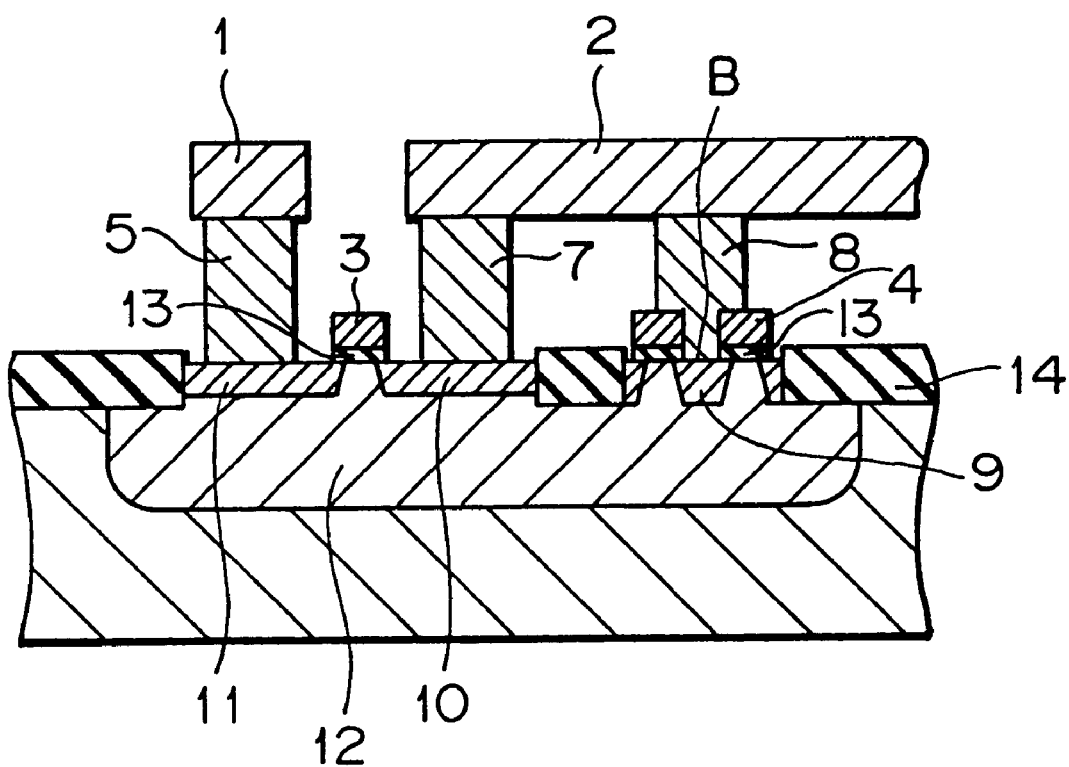
FIG. 4 is a cross sectional view taken along IV—IV in FIG. 3.

FIG. 3 is a plan view showing an electrostatic discharge protection device according to a first embodiment of the present invention, and FIG. 4 is a cross sectional view taken along the line IV—IV in FIG. 3.

As shown in FIG. 3, the contact area of the well contact 8 leading from the ground electrode 2 to the p well 12, to the $p^+$ diffusion layer 9 is limited by the gate electrodes 4 provided at both sides of the contact.

The gate electrodes 4 are formed by the same process equal to that of the patterning of the gate electrode 3. The gate electrode 3 and the source 10 are connected to the ground electrode 2, and the drain 11 is connected to the input/output pad 1 and the internal circuit as a protected element.

Furthermore, the numeral 5 is a drain contact, and the numeral 6 is a gate contact, and the numeral 7 is a source contact.

Since the gate electrodes 4 provided around the well contact 8 are patterned at the same time that the gate electrode 3 is formed, the gate electrodes 4 are insulated against the p well 12 by the gate oxide film 13, and are connected to the $p^+$ diffusion layer 9 by the area B, as shown in FIG. 4, and therefore, the connection resistance to the p well 12 is increased to be more than that when being connected to the p well 12 by a normal contact size. Furthermore, the numeral 14 is a field oxide film.

Next, the action of electrostatic protection of the present embodiment will be described.

Figure 5:
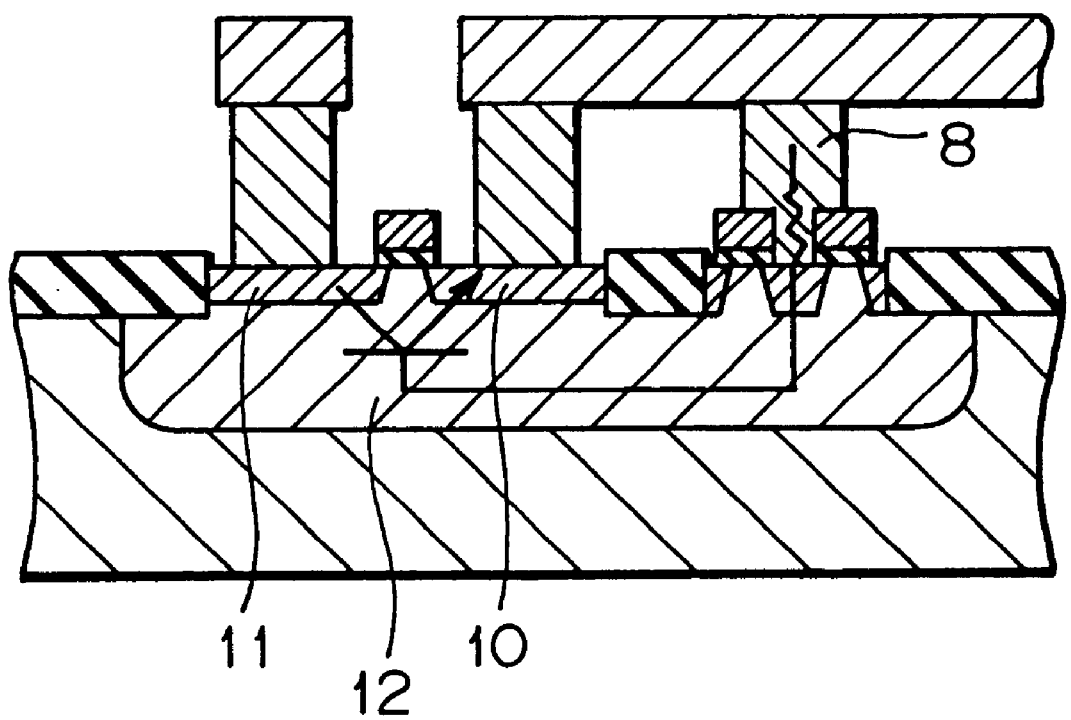
FIG. 5 is, similarly, a cross sectional view describing the equivalent circuit of a parasitic bipolar transistor in the first embodiment of the present invention.
Figure 6:
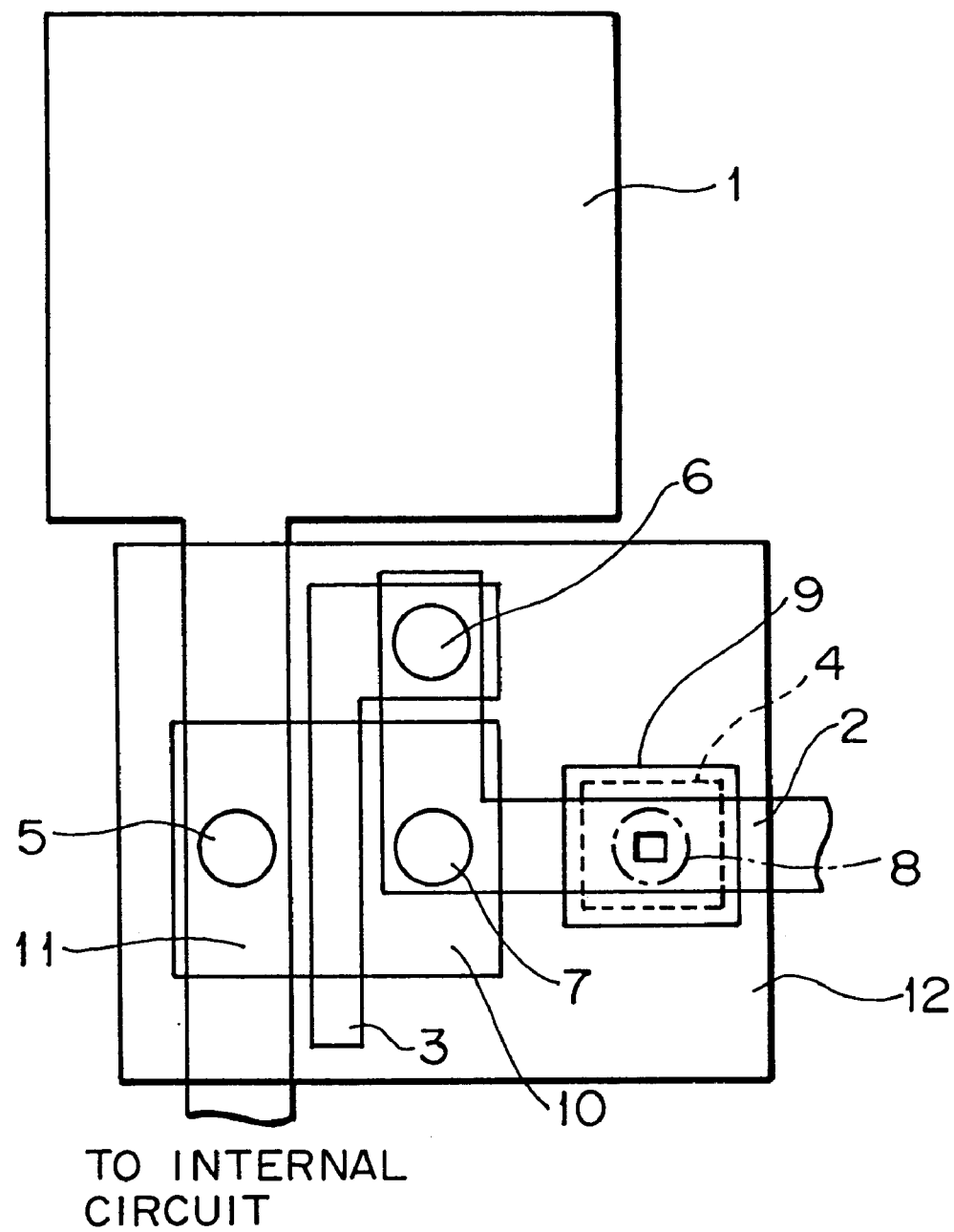
FIG. 6 is a plan view of a semiconductor device according to a second embodiment of the present invention.

As shown in FIG. 5, the MOS transistor as a protective element is a parasitic bipolar transistor wherein the drain 11 is a collector, and the p well 12 is a base, and the source 10 is an emitter, equivalently.

When a high voltage is applied to the drain 11 connected to the input/output pad 1, a leak current flows from the drain 11 to the p well 12. At this time, the potential of the p well 12 is raised, since the connection resistance from the p well 12 to the ground electrode is large.

This rising of the potential of the p well 12 is equal to the rising of the base potential of the parasitic bipolar transistor, and therefore, if the base potential is raised by approximately 0.6 V when compared with that of the source as an emitter, the parasitic bipolar transistor becomes in the on state, and a current flows from the drain 11 as a collector to the source 10 as an emitter, and the internal circuit is protected so that a high voltage may not be applied.

In the structure of a conventional electrostatic discharge protection device, the contacts of the source 10 of the MOS transistor as a protective element and the p well 12 are adjacent, and the potential difference between the source 10 and the p well 12 hardly arises. That is, the electrostatic protection is performed by performing the breakdown of the junction of the drain 11, without operating the parasitic bipolar transistor.

Since the voltage of the breakdown of the junction is unitarily determined by the impurity concentration of the junction portion, it is impossible to set the operational voltage of the protective element in a conventional electrostatic discharge protection device, as long as the injection of impurities or the like is not performed for the electrostatic discharge protection device.

On the other hand, in the present invention, it is possible to set the rising of the potential of the well because of the electrostatic discharge by the connection resistance of the well contact 8.

As mentioned above, the parasitic bipolar transistor becomes in the on state by the rising of the potential of the well, and it functions as an electrostatic discharge protection device, and therefore, it is possible to set the operational voltage of the electrostatic discharge protection device by the gate electrode 4 which increases the connection resistance of the well contact 8.

Furthermore, in the present invention, the connection resistance to the p well 12 is increased by limiting the contact area of the well contact 8 to the p$^+$ diffusion layer 9 with the gate electrode 4 formed simultaneously with the patterning of the gate electrode 3.

A similar effect can also be obtained by reducing the size of the contact hole. However, it is difficult to pierce a minute contact hole, as is well known from the micro loading effect during etching or the like.

In the present invention, the size of the contact hole may be a size capable of piercing, and the contact area of the well contact 8 is limited by using the patterning of a gate electrode which is most microscopic in the design rule of a semiconductor device.

As mentioned above, according to the present invention, an electrostatic discharge protection device with a low operational voltage can be produced, without increasing the number of steps and changing the manufacturing process.

Next, an electrostatic discharge protection device according to a second embodiment of the present invention will be described. In the present embodiment, the connection resistance to the p well 12 is raised, by making the shape of the gate electrode 4 which limits the contact area of the well contact 8 to the p$^+$ diffusion layer be a loop type.

According to this structure, when the contact hole is patterned by the optical lithography, even if the contact hole is transferred with a drift to the gate electrode 4, the same connection resistance can be obtained, as long as the central hole of the gate electrode 4 exists in the contact hole. Therefore, the operational voltage of the protective element can be stabilized.

Figure 7:
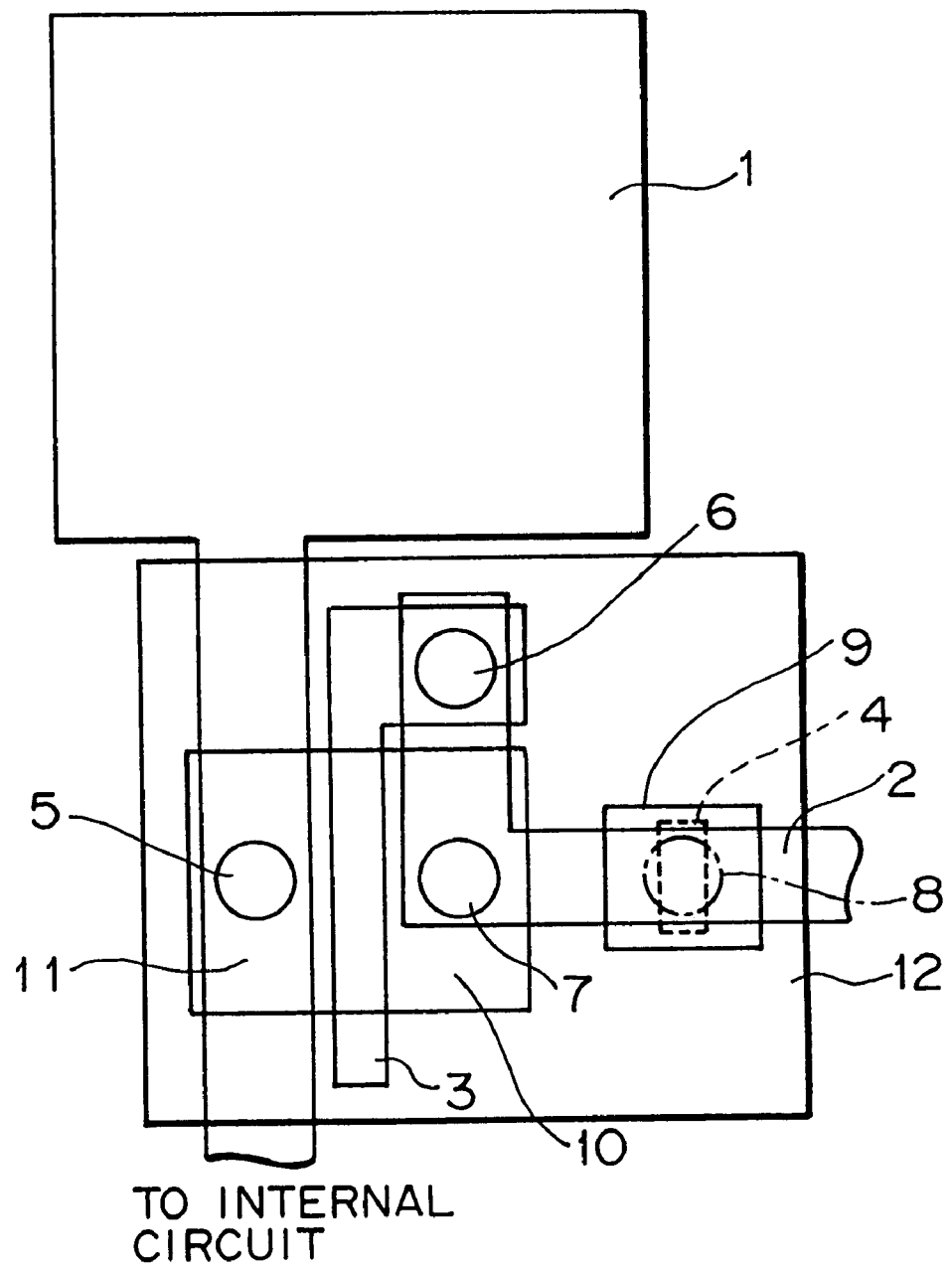
FIG. 7 is a plan view of a semiconductor device according to a third embodiment of the present invention.

Next, a third embodiment of the present invention will be described. FIG. 7 shows an electrostatic discharge protection device according to the third embodiment of the present invention. In the present embodiment, the contact area to the p$^+$ diffusion layer is limited, by the gate electrode 4 arranged in the center of the well contact 8.

According to the present embodiment, the connection resistance to the p well 12 can be raised when compared with the first and second embodiments.

Figure 8:
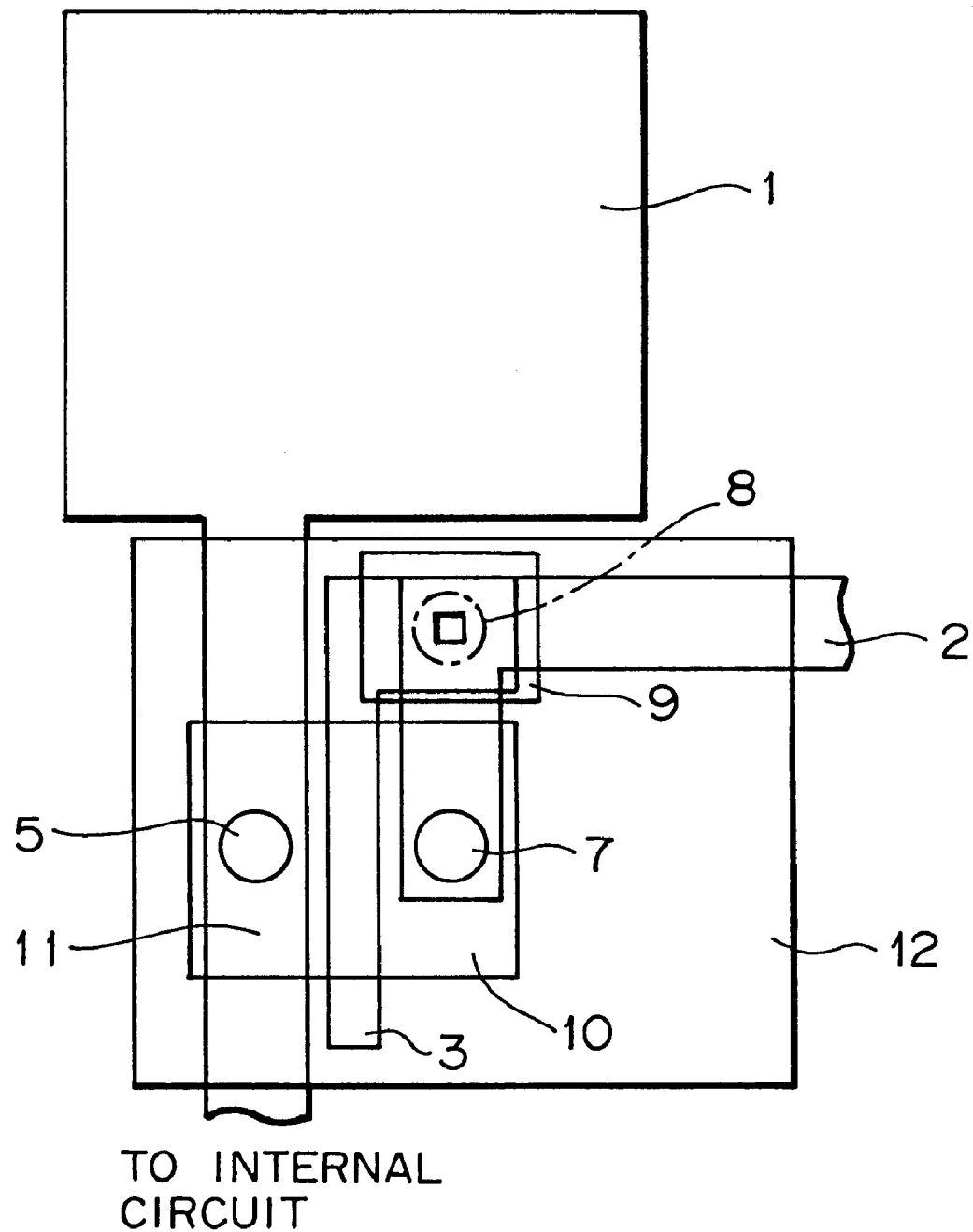
FIG. 8 is a plan view of a semiconductor device according to a fourth embodiment of the present invention.

Next, a fourth embodiment of the present invention will be described. FIG. 8 is a figure showing the present embodiment. In the present embodiment, the gate contact becomes unnecessary by connecting the gate electrode limiting the contact area to the well, to the gate electrode 3 of the MOS transistor.

Furthermore, the gate electrode 3 is connected to the well contact 8 to the p well 12, and the potential of the gate electrode 3 becomes approximately equal to that of the p$^+$ diffusion layer 9, and the potential of the p$^+$ diffusion layer 9 is approximately equal to the potential of the p well 12, and therefore, such a function as to ease the electric field applied to the gate oxide film 13 of the MOS transistor as a protective element and to protect the gate oxide film 13 against the insulation breakdown, is carried out.

By the way, in each of the above embodiments, the description was given by taking, as an example, the n channel MOS transistor as an electrostatic discharge protection device, but the electrostatic protection can also be carried out in the same structure by using the p channel MOS transistor.

What is claimed is:

1. A semiconductor device for preventing a gate insulation breakdown by an electrostatic discharge from the outside to a signal input/output section of an integrated circuit including an MOS transistor, which is arranged such that a contact area of a well contact hole to a well is limited by a gate electrode provided in a contact hole area so as to raise connection resistance to the well.

2. The semiconductor device according to claim 1, wherein the connection resistance of the contact hole to the well is set to a value of resistance capable of making a parasitic bipolar transistor of an MOS transistor be in the on state at a voltage not more than a voltage to cause a gate insulation breakdown.

3. A semiconductor device comprising:

an input/output wiring;

a source wiring for supplying an ground potential and a source potential;

a well of one conductive type which is formed on a surface layer portion in a semiconductor substrate of one conductive type and has an impurity concentration higher than the impurity concentration of the semiconductor substrate;

a source and a drain of the opposite conductive type which are formed on a surface layer portion in the well of one conductive type and are separated by a channel area, said drain being connected to said input/output wiring and said source being connected to said source wiring;

a well contact area of one conductive type which is formed on the surface layer portion in the well of one conductive type and is separated from said source and drain by a field insulation film, the well contact area being connected to the source wiring;

a contact hole which is formed on the surface of said semiconductor substrate and connects a metal wiring on said well contact area and the well contact area;

a first gate electrode which is formed on the channel area through a gate insulation film on the surface of said semiconductor substrate, the first gate electrode being connected to the source wiring; and a second gate electrode which is formed in a well contact hole area through the gate insulation film on the surface of said semiconductor substrate, the second gate electrode being connected to the source wiring.

4. The semiconductor device according to claim 3, which is arranged such that the contact area to said well of one conductive type is limited by a gate electrode formed in said well contact hole area.

5. The semiconductor device according to claim 3, which is arranged such that the contact area to said well of one conductive type is limited by arranging gate electrodes formed in said well contact hole area on both sides of the well contact.

6. The semiconductor device according to claim 3, which is arranged such that the contact area to said well of one conductive type is limited by arranging gate electrodes formed in said well contact hole area in the form of surrounding the periphery of the well contact.

7. The semiconductor device according to claim 3, which is arranged such that the contact area to said well of one conductive type is limited by arranging a gate electrode formed in said well contact hole area in the central portion of the well contact.

8. The semiconductor device according to claim 3, which is arranged such that the contact area to said well of one conductive type is limited by connecting a gate electrode formed in said well contact hole area to a gate electrode formed on said channel area.

9. A insulation breakdown preventing method of a semiconductor device for preventing a gate insulation breakdown by an electrostatic discharge from the outside to signal input/output section of an integrated circuit including an MOS transistor, wherein the contact area of a well contact hole to a well is limited by a gate electrode provided in a contact hole area so as to raise the connection resistance to the well, and consequently, a parasitic bipolar transistor of an MOS transistor is made to be in the on state at a voltage not more than the voltage to cause a gate insulation breakdown, and the excessive voltage applied to a drain is allowed to flow to a ground electrode or a source electrode.

* * * * *